United States Patent
Wei et al.

(10) Patent No.: US 9,136,348 B2
(45) Date of Patent: Sep. 15, 2015

(54) SEMICONDUCTOR STRUCTURE AND FABRICATION METHOD THEREOF

(75) Inventors: Ming-Te Wei, Tainan (TW); Shin-Chuan Huang, Tainan (TW); Yu-Hsiang Hung, Tainan (TW); Po-Chao Tsao, New Taipei (TW); Chia-Jui Liang, Tainan (TW); Ming-Tsung Chen, Hsin-Chu Hsien (TW); Chia-Wen Liang, Hsinchu (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 123 days.

(21) Appl. No.: 13/417,337

(22) Filed: Mar. 12, 2012

(65) Prior Publication Data

US 2013/0234261 A1  Sep. 12, 2013

(51) Int. Cl.
*H01L 29/66* (2006.01)
*H01L 29/78* (2006.01)
*H01L 29/165* (2006.01)

(52) U.S. Cl.
CPC .......... *H01L 29/6656* (2013.01); *H01L 29/165* (2013.01); *H01L 29/66636* (2013.01); *H01L 29/7834* (2013.01); *H01L 29/7848* (2013.01)

(58) Field of Classification Search
CPC ............ H01L 29/6656; H01L 29/7848; H01L 29/7834
USPC ........................................... 257/401, E21.619
See application file for complete search history.

(56) References Cited

U.S. PATENT DOCUMENTS

| | | |
|---|---|---|
| 4,891,303 A | 1/1990 | Garza |
| 5,217,910 A | 6/1993 | Shimizu |
| 5,273,930 A | 12/1993 | Steele |
| 5,356,830 A | 10/1994 | Yoshikawa |
| 5,372,957 A | 12/1994 | Liang |
| 5,385,630 A | 1/1995 | Philipossian |
| 5,399,506 A | 3/1995 | Tsukamoto |
| 5,625,217 A | 4/1997 | Chau |
| 5,777,364 A | 7/1998 | Crabbe |
| 5,783,478 A | 7/1998 | Chau |
| 5,783,479 A | 7/1998 | Lin |
| 5,960,322 A | 9/1999 | Xiang |
| 6,030,874 A | 2/2000 | Grider |
| 6,048,756 A | 4/2000 | Lee |
| 6,074,954 A | 6/2000 | Lill |
| 6,100,171 A | 8/2000 | Ishida |
| 6,110,787 A * | 8/2000 | Chan et al. ............... 438/300 |
| 6,165,826 A | 12/2000 | Chau |
| 6,165,881 A | 12/2000 | Tao |
| 6,191,052 B1 | 2/2001 | Wang |
| 6,228,730 B1 | 5/2001 | Chen |
| 6,274,447 B1 | 8/2001 | Takasou |
| 6,355,533 B2 | 3/2002 | Lee |
| 6,365,476 B1 | 4/2002 | Talwar |

(Continued)

*Primary Examiner* — Amar Movva
(74) *Attorney, Agent, or Firm* — Winston Hsu; Scott Margo

(57) ABSTRACT

A semiconductor structure includes a gate structure disposed on a substrate and having an outer spacer, a recess disposed in the substrate and adjacent to the gate structure, a doped epitaxial material filling up the recess, a cap layer including an undoped epitaxial material and disposed on the doped epitaxial material, a lightly doped drain disposed below the cap layer and sandwiched between the doped epitaxial material and the cap layer, and a silicide disposed on the cap layer and covering the doped epitaxial material to cover the cap layer together with the outer spacer without directly contacting the lightly doped drain.

13 Claims, 5 Drawing Sheets

(56) References Cited

U.S. PATENT DOCUMENTS

| | | |
|---|---|---|
| 6,368,926 B1 | 4/2002 | Wu |
| 6,444,591 B1 | 9/2002 | Schuegraf |
| 6,537,370 B1 | 3/2003 | Hernandez |
| 6,544,822 B2 | 4/2003 | Kim |
| 6,605,498 B1 | 8/2003 | Murthy |
| 6,613,695 B2 | 9/2003 | Pomarede |
| 6,621,131 B2 | 9/2003 | Murthy |
| 6,624,068 B2 | 9/2003 | Thakar |
| 6,632,718 B1 | 10/2003 | Grider |
| 6,642,122 B1 | 11/2003 | Yu |
| 6,664,156 B1 | 12/2003 | Ang |
| 6,676,764 B2 | 1/2004 | Joo |
| 6,699,763 B2 | 3/2004 | Grider |
| 6,703,271 B2 | 3/2004 | Yeo |
| 6,777,275 B1 | 8/2004 | Kluth |
| 6,806,151 B2 | 10/2004 | Wasshuber |
| 6,809,402 B1 | 10/2004 | Hopper |
| 6,858,506 B2 | 2/2005 | Chang |
| 6,861,318 B2 | 3/2005 | Murthy |
| 6,864,135 B2 | 3/2005 | Grudowski |
| 6,869,867 B2 | 3/2005 | Miyashita |
| 6,887,751 B2 | 5/2005 | Chidambarrao |
| 6,887,762 B1 | 5/2005 | Murthy |
| 6,891,192 B2 | 5/2005 | Chen |
| 6,930,007 B2 | 8/2005 | Bu |
| 6,946,350 B2 | 9/2005 | Lindert |
| 6,962,856 B2 | 11/2005 | Park |
| 6,972,461 B1 | 12/2005 | Chen |
| 6,991,979 B2 | 1/2006 | Ajmera |
| 6,991,991 B2 | 1/2006 | Cheng |
| 7,037,773 B2 | 5/2006 | Wang |
| 7,060,576 B2 | 6/2006 | Lindert |
| 7,060,579 B2 | 6/2006 | Chidambaram |
| 7,112,495 B2 | 9/2006 | Ko |
| 7,118,952 B2 | 10/2006 | Chen |
| 7,132,338 B2 | 11/2006 | Samoilov |
| 7,169,675 B2 | 1/2007 | Tan |
| 7,183,596 B2 | 2/2007 | Wu |
| 7,202,124 B2 | 4/2007 | Fitzgerald |
| 7,217,627 B2 | 5/2007 | Kim |
| 7,288,822 B1 | 10/2007 | Ting |
| 7,303,999 B1 | 12/2007 | Sriraman |
| 7,335,959 B2 | 2/2008 | Curello |
| 7,410,859 B1 | 8/2008 | Peidous |
| 7,462,239 B2 | 12/2008 | Brabant |
| 7,482,211 B2 | 1/2009 | Nieh |
| 7,491,615 B2 | 2/2009 | Wu |
| 7,494,856 B2 | 2/2009 | Zhang |
| 7,494,858 B2 | 2/2009 | Bohr |
| 7,592,231 B2 | 9/2009 | Cheng |
| 7,667,227 B2 | 2/2010 | Shimamune |
| 7,691,752 B2 | 4/2010 | Ranade |
| 7,838,370 B2 | 11/2010 | Mehta |
| 2002/0160587 A1 | 10/2002 | Jagannathan |
| 2002/0182423 A1 | 12/2002 | Chu |
| 2003/0181005 A1 | 9/2003 | Hachimine |
| 2003/0203599 A1 | 10/2003 | Kanzawa |
| 2004/0045499 A1 | 3/2004 | Langdo |
| 2004/0067631 A1 | 4/2004 | Bu |
| 2004/0227164 A1 | 11/2004 | Lee |
| 2005/0070076 A1 | 3/2005 | Dion |
| 2005/0079692 A1 | 4/2005 | Samoilov |
| 2005/0082616 A1 | 4/2005 | Chen |
| 2005/0139231 A1 | 6/2005 | Abadie |
| 2005/0260830 A1 | 11/2005 | Kwon |
| 2005/0285193 A1 | 12/2005 | Lee |
| 2005/0287752 A1 | 12/2005 | Nouri |
| 2006/0051922 A1 | 3/2006 | Huang |
| 2006/0057859 A1 | 3/2006 | Chen |
| 2006/0076627 A1 | 4/2006 | Chen |
| 2006/0088968 A1 | 4/2006 | Shin |
| 2006/0115949 A1 | 6/2006 | Zhang |
| 2006/0163558 A1 | 7/2006 | Lee |
| 2006/0228842 A1 | 10/2006 | Zhang |
| 2006/0231826 A1 | 10/2006 | Kohyama |
| 2006/0258126 A1 | 11/2006 | Shiono |
| 2006/0281288 A1 | 12/2006 | Kawamura |
| 2006/0286730 A1 | 12/2006 | Liu |
| 2006/0292779 A1 | 12/2006 | Chen |
| 2006/0292783 A1 | 12/2006 | Lee |
| 2007/0023847 A1 | 2/2007 | Rhee |
| 2007/0034906 A1 | 2/2007 | Wang |
| 2007/0049014 A1 | 3/2007 | Chen |
| 2007/0072353 A1 | 3/2007 | Wu |
| 2007/0072376 A1 | 3/2007 | Chen |
| 2007/0082451 A1 | 4/2007 | Samoilov |
| 2007/0128783 A1 | 6/2007 | Ting |
| 2007/0166929 A1 | 7/2007 | Matsumoto |
| 2007/0262396 A1 | 11/2007 | Zhu |
| 2008/0014688 A1 | 1/2008 | Thean |
| 2008/0061366 A1 | 3/2008 | Liu |
| 2008/0067545 A1 | 3/2008 | Rhee |
| 2008/0076236 A1 | 3/2008 | Chiang |
| 2008/0085577 A1 | 4/2008 | Shih |
| 2008/0116525 A1 | 5/2008 | Liu |
| 2008/0124874 A1 | 5/2008 | Park |
| 2008/0128746 A1 | 6/2008 | Wang |
| 2008/0142886 A1 | 6/2008 | Liao |
| 2008/0220579 A1 | 9/2008 | Pal |
| 2008/0233722 A1 | 9/2008 | Liao |
| 2008/0233746 A1 | 9/2008 | Huang |
| 2009/0039389 A1 | 2/2009 | Tseng |
| 2009/0045456 A1 | 2/2009 | Chen |
| 2009/0095992 A1 | 4/2009 | Sanuki |
| 2009/0108291 A1* | 4/2009 | Cheng et al. ............ 257/190 |
| 2009/0117715 A1 | 5/2009 | Fukuda |
| 2009/0124056 A1 | 5/2009 | Chen |
| 2009/0166625 A1 | 7/2009 | Ting |
| 2009/0184402 A1 | 7/2009 | Chen |
| 2009/0186475 A1 | 7/2009 | Ting |
| 2009/0246922 A1 | 10/2009 | Wu |
| 2009/0278170 A1 | 11/2009 | Yang |
| 2009/0302348 A1 | 12/2009 | Adam |
| 2009/0315120 A1* | 12/2009 | Shifren et al. ............ 257/386 |
| 2010/0001317 A1 | 1/2010 | Chen |
| 2010/0093147 A1 | 4/2010 | Liao |

\* cited by examiner

SEMICONDUCTOR STRUCTURE AND FABRICATION METHOD THEREOF

BACKGROUND OF THE INVENTION

1. Field of the Invention

The present invention generally relates to a semiconductor structure and a method for making the semiconductor structure. In particular, the present invention is directed to a semiconductor structure with a complete lightly doped drain region which is sandwiched between a cap layer and a doped epitaxial material and a method for making the semiconductor structure to improve the reliability of the semiconductor structure.

2. Description of the Prior Art

In order to increase the carrier mobility of a semiconductor element, an advanced approach applies a stress to a gate channel. For example, an optional compressive or tensile stress may be applied to the gate channel. When it comes to a compressive stress which is required to be applied to the gate channel, the use of a SiGe epitaxial material is a popular fashion. A suitable compressive stress is generated towards the gate channel by means of larger germanium atoms in the SiGe epitaxial material.

It is also known that the stress is more effectively delivered to the gate channel of a semiconductor element and to adjust the carrier mobility when the stress source is closer to the gate channel so a recess is usually constructed adjacent to the gate structure, preferably with a collaterally formed tip deeply penetrating the gate channel, to deliberately deliver the stress to the gate channel. However, the reliability of the semiconductor structure would be susceptible to such approach.

Accordingly, a novel semiconductor structure is still needed to exhibit a better reliability.

SUMMARY OF THE INVENTION

Given the above, the present invention proposes a novel semiconductor structure and a novel method for making the semiconductor structure to exhibit a better reliability. For example, the novel semiconductor structure of the present invention has a complete lightly doped drain region sandwiched between a cap layer and a doped epitaxial material to show an improved element reliability. Or alternatively, the novel semiconductor structure of the present invention has a cap layer to segregate a lightly doped drain region from a silicide so that the lightly doped drain region does not directly contact the silicide and makes itself a complete lightly doped drain region.

The present invention in a first aspect proposes a semiconductor structure. The semiconductor structure at least includes a substrate, a gate structure, at least one recess, a doped epitaxial material, a lightly doped drain region (LDD), a cap layer and a silicide. The gate structure is disposed on the substrate. At least one recess is disposed in the substrate and adjacent to the gate structure. The doped epitaxial material fills up the at least one recess. The lightly doped drain region is disposed at a top region of the doped epitaxial material. The cap layer includes an undoped epitaxial material, is disposed on the doped epitaxial material and covers the doped epitaxial material.

In one embodiment of the present invention, the semiconductor structure of the present invention further includes an interlayer dielectric layer and a contact plug. The interlayer dielectric layer covers the cap layer and the gate structure. The contact plug is disposed in the interlayer dielectric layer and electrically connected to the cap layer In another embodiment of the present invention, the semiconductor structure of the present invention further includes a silicide which at least partially covers the cap layer and is completely covered by the contact plug. In particular, the cap layer further segregates the lightly doped drain region from the silicide so that the lightly doped drain region is in no way in direct contact with the silicide.

In another embodiment of the present invention, the semiconductor structure of the present invention further includes a silicide which is disposed on the cap layer and completely covers the cap layer.

In another embodiment of the present invention, the gate structure includes a spacer simultaneously in direct contact with both the cap layer and the lightly doped drain region.

In another embodiment of the present invention, the gate structure further includes an outer spacer disposed outside of the spacer and the outer spacer as well as the silicide together cover the cap layer.

In another embodiment of the present invention, at least one recess includes a tip disposed under the gate structure.

In another embodiment of the present invention, the lightly doped drain region overlaps the tip of at least one recess.

In another embodiment of the present invention, the lightly doped drain region completely overlaps the top region of the doped epitaxial material and extends to below the gate structure.

In another embodiment of the present invention, the gate structure is a PMOS gate or an NMOS gate.

In another embodiment of the present invention, the doped epitaxial material includes two different tetravalent elements, such as Si and C, or Si and Ge.

In another embodiment of the present invention, the lightly doped drain region completely overlaps the top of the doped epitaxial material and extends to below the gate structure.

The present invention in a second aspect proposes a method for forming a semiconductor structure. First, a substrate is provided. The substrate has a gate structure disposed on the substrate, and at least one recess disposed in the substrate and adjacent to the gate structure. Second, a doped epitaxial material layer is formed to fill up the at least one recess. Then, a doping step is carried out to form a complete lightly doped drain region disposed at a top region of the doped epitaxial material layer. Later, a cap layer is formed. The cap layer includes an undoped epitaxial material, is disposed on the lightly doped drain region and covers the lightly doped drain region.

In one embodiment of the present invention, the method for forming a semiconductor structure further includes a step to form an outer spacer to surround the gate structure and to partially cover the cap layer.

In another embodiment of the present invention, after forming the outer spacer the method for forming a semiconductor structure further includes the following steps. First, a heavily doping step is carried out to form a source/drain region in the cap layer and in the doped epitaxial material layer. Then, an interlayer dielectric layer is formed to cover the cap layer and the gate structure.

In another embodiment of the present invention, the method for forming a semiconductor structure further includes the following steps. A silicide layer is formed to completely cover the cap layer before the interlayer dielectric layer is formed. Then, a contact plug is formed so that the contact plug penetrates the interlayer dielectric layer, partially covers the silicide layer which is disposed on the cap layer and is electrically connected to the cap layer.

In another embodiment of the present invention, the method for forming a semiconductor structure further includes the following steps after the interlayer dielectric layer is formed. A silicide layer then a contact plug are formed so that the contact plug penetrates the interlayer dielectric layer, completely covers the silicide layer which is disposed on the cap layer and is electrically connected to the cap layer.

In another embodiment of the present invention, the doping step is a tilt angle implantation step so that the lightly doped drain region completely overlaps the top of the doped epitaxial material layer and extends to below the gate structure.

In another embodiment of the present invention, the lightly doped drain region overlaps the tip of the at least one recess and the tip extends to below the gate structure.

In another embodiment of the present invention, the gate structure is a PMOS gate or an NMOS gate.

In another embodiment of the present invention, the doped epitaxial material includes two different tetravalent elements, such as Si and C, or Si and Ge.

These and other objectives of the present invention will no doubt become obvious to those of ordinary skill in the art after reading the following detailed description of the preferred embodiment that is illustrated in the various figures and drawings.

DETAILED DESCRIPTION

The present invention provides a novel semiconductor structure which has a complete lightly doped drain region sandwiched between a cap layer and a doped epitaxial material to show an improved element reliability. Or alternatively, the novel semiconductor structure of the present invention has a cap layer which segregates a lightly doped drain region from a silicide so that the lightly doped drain region does not directly contact the silicide and makes itself a complete lightly doped drain region. A complete lightly doped drain region helps to raise the saturated current value ($I_{sat}$) of the semiconductor element.

Figure 1:
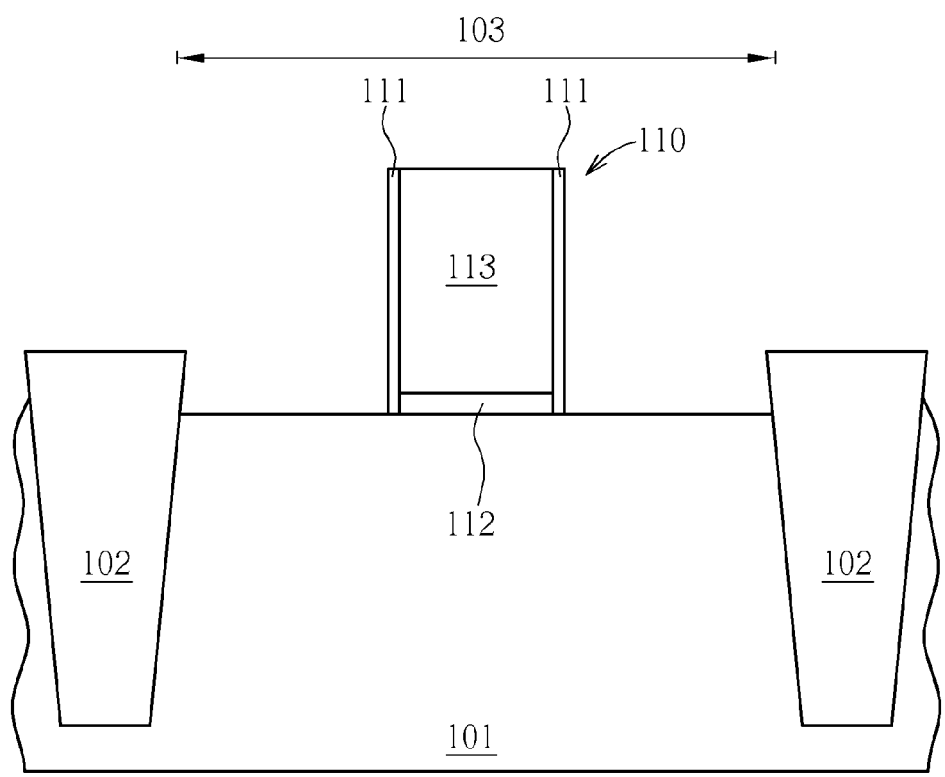
FIGS. 1 to 10 illustrate an exemplary process to form the semiconductor element of the present invention.

The present invention in a first aspect provides a method for forming a semiconductor structure to obtain a complete lightly doped drain region which has not been slashed. Please refer to FIGS. 1 to 9 which illustrate a process to form the semiconductor element of the present invention. First, as shown in FIG. 1, a substrate 101 is provided. The substrate 101 may be a doped semiconductive material, such as doped Si. In addition, there may be several shallow trench isolations 102 for use as electric segregation in the substrate 101 as well as several doped wells (not shown) formed in advance.

The following steps may be a possible way to form the shallow trench isolations 102. First, a hard mask (not shown) is used to etch the substrate 101 to form several trenches (not shown) for the shallow trench isolations 102. In particular, the region 103 of the substrate 101 may be used for an NMOS or a PMOS, to use embedded SiGe for PMOS or to use embedded SiC for NMOS to improve the carrier mobility of the MOS properties. Later, an isolation material (not shown) is used to fill the previously formed trenches (not shown) to obtain the needed shallow trench isolations 102 after the planarization is carried out and the excess isolation material (not shown) and the hard mask (not shown) are removed.

Further, a gate structure 110 may be formed on the substrate 101 in the region 103. The gate structure 110 may be a PMOS semiconductor gate or an NMOS semiconductor gate. For example, the gate structure 110 may include an inner spacer 111, a gate dielectric layer 112, an optional high-k dielectric layer (not shown), an optional barrier layer (not shown), a gate material layer 113 and an optional top layer (not shown). The gate dielectric layer 112 is in direct contact with the substrate 101 for use as the electric isolation between the gate structure 110 and the substrate 101. Besides, an optional lightly drain doping (LDD) implanting step for the NMOS may be carried out in advance.

If the gate structure 110 is a Si gate, the gate dielectric layer 112 may include a Si compound, such as silicon oxide, silicon nitride, silicon oxynitride or the combination thereof. If the gate structure 110 is a metal gate, the gate dielectric layer 112 may include an oxide, such as silicon oxide. The optional high-k dielectric layer may include a high-k material, such as hafnium oxide ($HfO_2$), hafnium silicon oxide, ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide, ($ZrO_2$), strontium titanate oxide ($SrTiO_3$), zirconium silicon oxide ($ZrSiO_4$), hafnium zirconium oxide ($HfZrO_4$), strontium bismuth tantalite ($SrBi_2Ta_2O_9$, SBT), lead zirconate titanate ($PbZr_xTi_{1-x}O_3$, PZT), or barium strontium titanate ($Ba_xSr_{1-x}TiO_3$, BST). The barrier layer may serve to segregate the gate material layer 113 and the bottom. The barrier layer may include a metal compound, such as titanium nitride or TaN.

Figure 2:
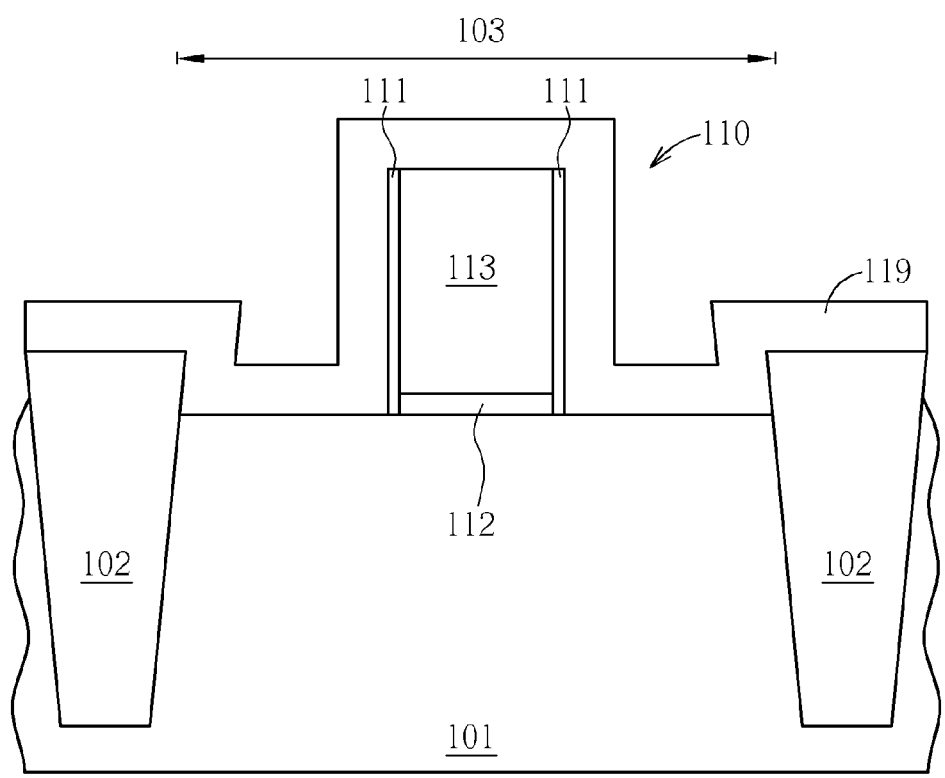
Figure 3:
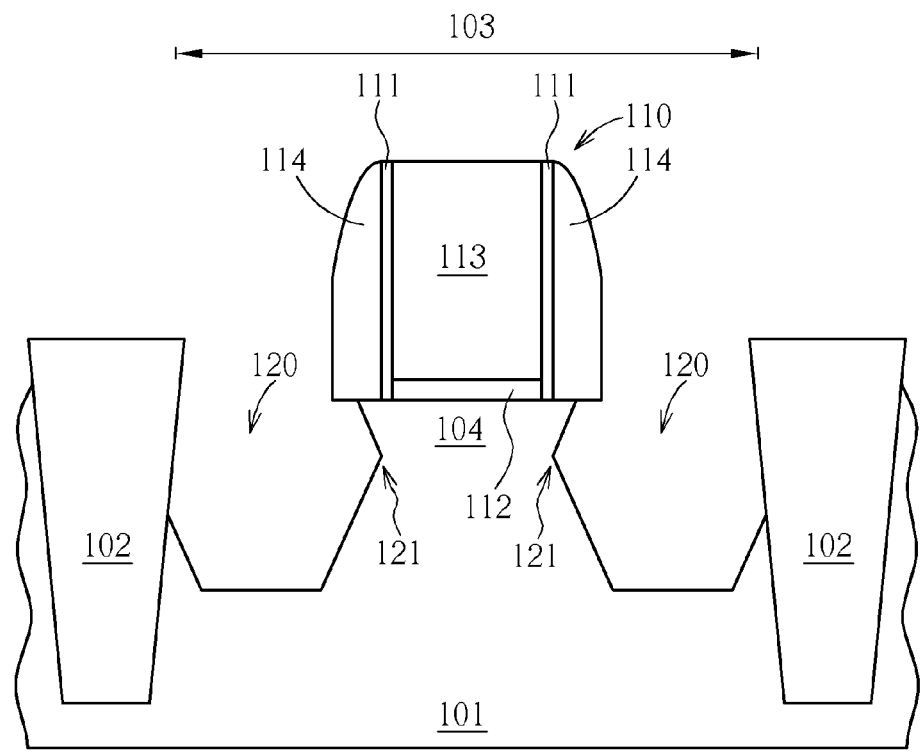

Second, at least one recess is formed in the substrate 101 adjacent to the gate structure 110. The procedures may be as follows. First, as shown in FIG. 2, a material layer 119 is used to evenly cover the substrate 101, the shallow trench isolation 102, and the gate structure 110. The material layer 119 may include a Si compound, such as silicon oxide, silicon nitride, silicon oxynitride or the combination thereof. Then, as shown in FIG. 3, the material layer 119 is patterned to be the protective layers in other regions and to simultaneously turn this material layer 119 in the region 103 to become a spacer 114 which surrounds the inner spacer 111 of the gate structure 110 to be part of the gate structure 110 after lithographic and etching procedures. Preferably, these etching procedures may also be used to remove part of the substrate 101 to obtain at least one recess 120. Or, independent etching procedures may also be used to remove part of the substrate 101 to obtain at least one recess 120.

The etching procedures may be dry etching and wet etching and the recess 120 may have special 3-dimentional shapes in accordance with different etching recipes. For example, a dry etching is first carried out and followed by a wet etching to laterally extend the recess 120 to partially occupy the gate channel 104 below the gate structure 110. Simultaneously, part of the recess 120 below the gate structure 110 may be in a shape of a wedge so that the recess 120 may further include a tip 121 disposed below the gate structure 110.

Figure 4:
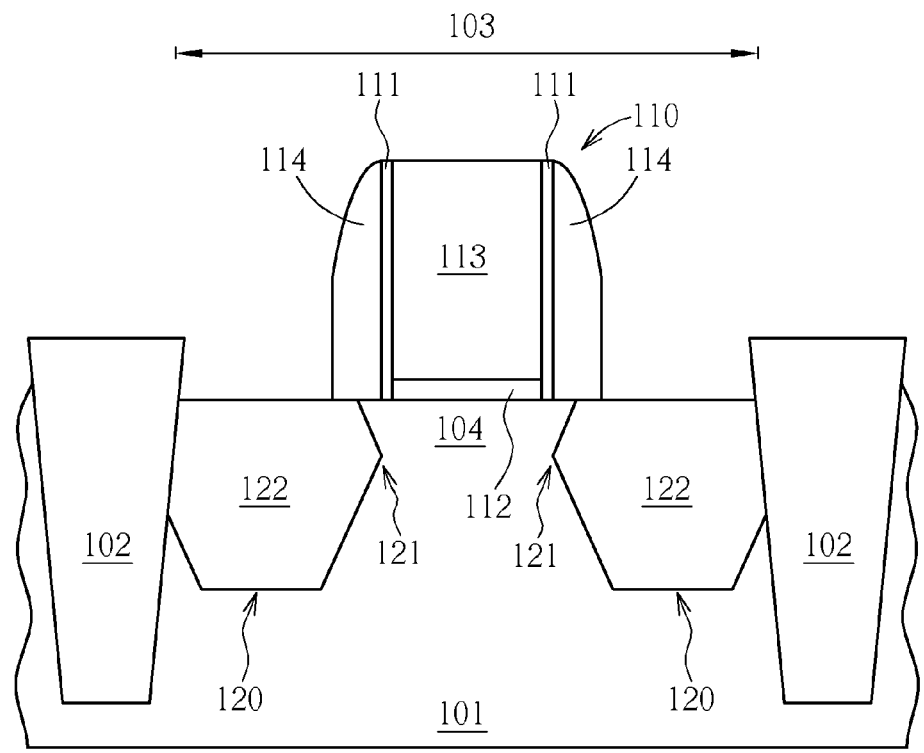

Next, please refer to FIG. 4, after a cleaning procedure, a doped epitaxial material 122 is used to fill up the recess 120 by an epitaxial step. Optionally, before the growth of the epitaxial material 122, a hydrogen pre-baking step may be introduced or the growth of the doped epitaxial material 122 and the hydrogen pre-baking step are carried out in-situ. The doped epitaxial material 122 usually includes at least two different tetravalent materials and a suitable dopant. The two different tetravalent materials may be Si and Ge, or Si and C. The dopant may be B or P. Further, the doped epitaxial material 122 may have several sections. For example, a buffer layer (not shown) which is disposed at the bottom of the recess 120 may include Ge of low concentration, and may have no boron or a little of B, to reduce the dissimilarity of different lattices with respect to the substrate 101. The bulk layer (not shown) which is disposed in the middle of the recess 120 may include Ge of high concentration and a lot of B, to mainly serve as the stress source of the gate channel 104.

Figure 5:
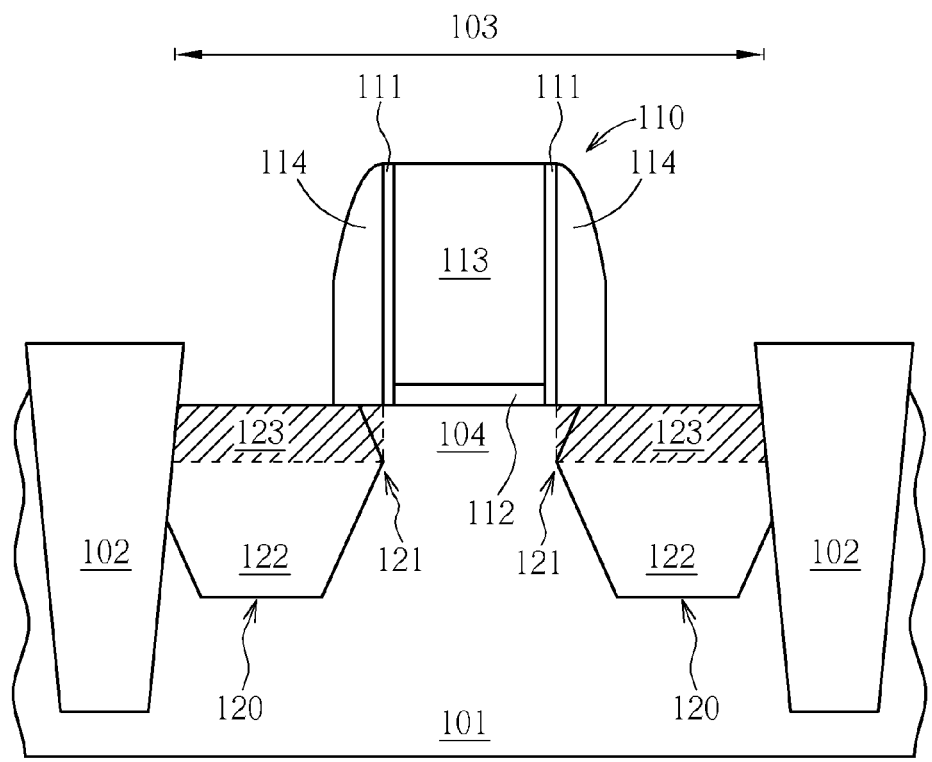

Later, as shown in FIG. 5, a doping step is carried out in the region 103, such as a PMOS region with the recess 120. For example, first a lithographic step is used to define the PMOS region for the lightly doped drain doping step. The lightly doped drain doping step may be a vertical or a tilt angle implantation step to form a lightly doped drain region (LDD) 123 disposed in the doped epitaxial material 122 at both sides of the gate structure 110. The lightly doped drain region (LDD) 123 is usually disposed at a top region of the doped epitaxial material layer 122, and preferably entirely overlaps the top region, and further extends to the substrate 101 below the spacer 114 or even below the inner spacer 111.

In one embodiment of the present invention, the tilt angle of the implantation step may be suitably adjusted so that the lightly doped drain region (LDD) 123 entirely overlaps the tip 121. Preferably, the lightly doped drain region (LDD) 123 may extend to the substrate 101 right below the spacer 114. Optionally, a pocket implantation, i.e. a halo doping step may also be carried out.

Figure 6:
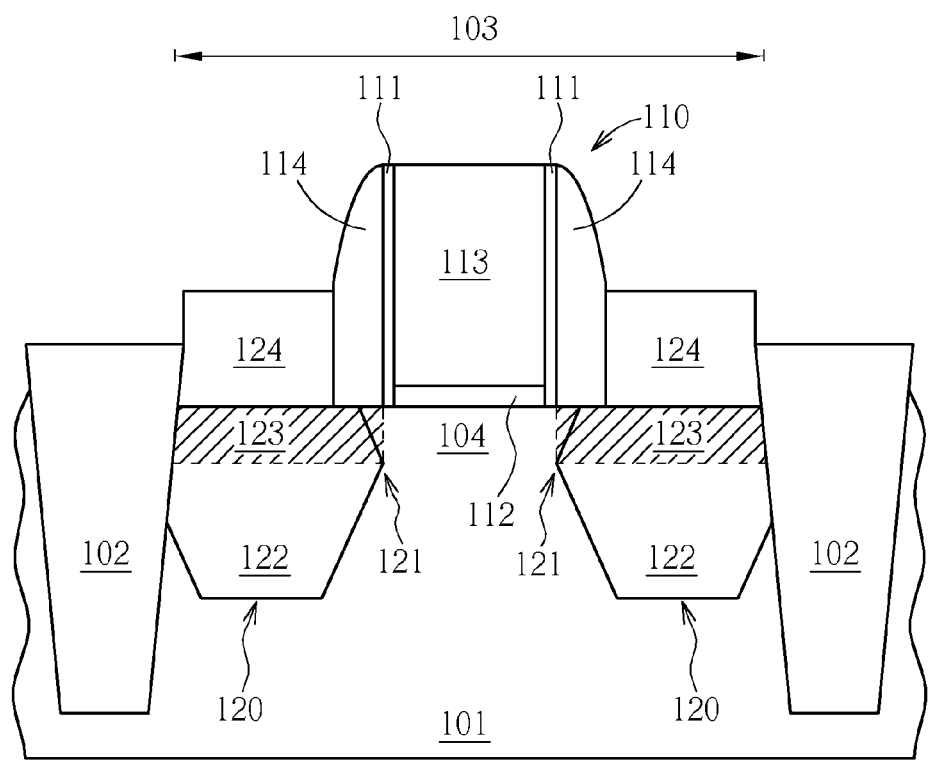

After that, as shown in FIG. 6, a cap layer 124 is formed on the doped epitaxial material layer 122 and next to the spacer 114 to completely cover the doped epitaxial material layer 122 and the lightly doped drain region (LDD) 123 so that the lightly doped drain region (LDD) 123 is disposed under the cap layer 124, and the spacer 114 is capable of directly contacting the lightly doped drain region (LDD) 123 and the cap layer 124 at the same time. The lightly doped drain region 123 is sandwiched between a bottom of the doped epitaxial material 122 and the cap layer 124. The cap layer 124 includes an undoped epitaxial material such as Si and Ge of low concentration or no Ge at all, and the cap layer 124 is substantially in particular dopant free.

Figure 7:
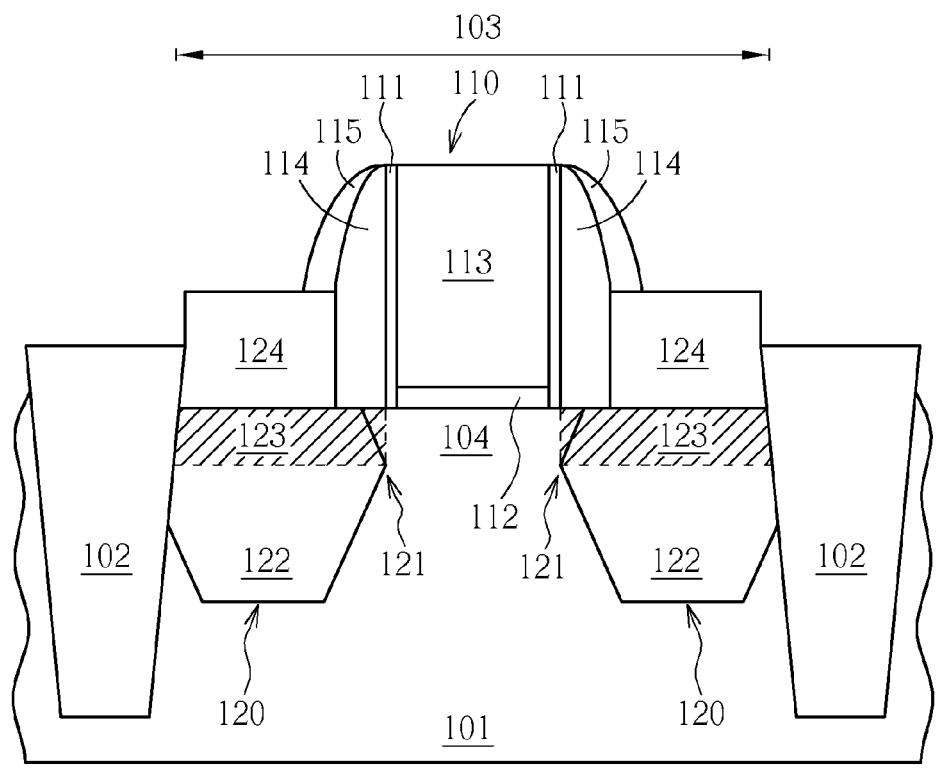

Further, as shown in FIG. 7, an outer spacer 115 which surrounds the gate structure 110 is formed outside of the spacer 114 of the gate structure 110 so that the outer spacer 115 is on the top of the cap layer 124, and the outer spacer 115 of the gate structure 110 may partially cover the cap layer 124. The procedures to form the outer spacer 115 may be as follows. First, a material layer (not shown) is used to evenly cover the shallow trench isolations 102, the gate structure 110 and the cap layer 124. The material layer (not shown) may include a Si compound, such as silicon oxide, silicon nitride, silicon oxynitride or the combination thereof. Then, the material layer (not shown) is patterned to become the outer spacer 115 which surrounds the spacer 114 of the gate structure 110 to be part of the gate structure 110 after some suitable etching procedures.

Figure 8:
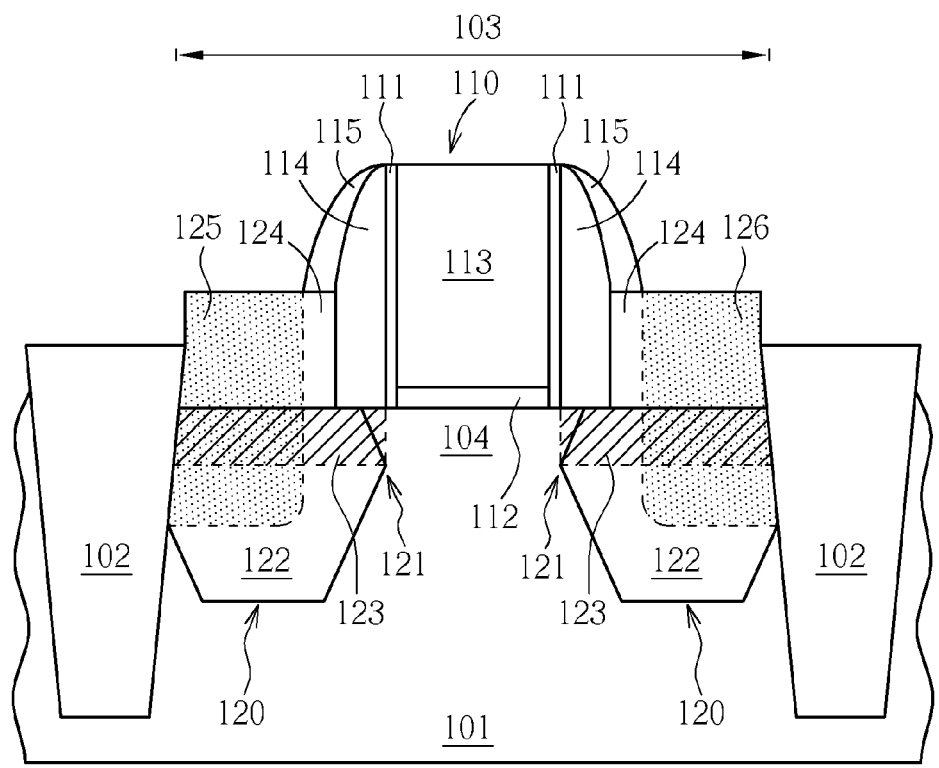

Continuing, as shown in FIG. 8, a heavily doping procedure is carried out on the cap layer 124 to form a source doping region 125 and a drain doping region 126 together. Preferably, the source/drain implanting procedure may penetrate the cap layer 124 and the complete lightly doped drain region (LDD) 123 to deeply reach the doped epitaxial material 122. Further, due to the shielding of the outer spacer 115, the source doping region 125 and the drain doping region 126 may not entirely overlap the complete lightly doped drain region (LDD) 123 and the cap layer 124. At the same time, the source doping region 125 and the drain doping region 126 may not directly contact the spacer 114. Optionally, there may be an annealing step to follow the heavily doping procedure. The annealing step may be a conventional source/drain annealing step, such as a rapid thermal annealing step (RTA) or laser annealing, to activate the dopant in the source/drain implanting procedure to simultaneously forma source 125 and a drain 126 in the substrate 101.

Figure 9:
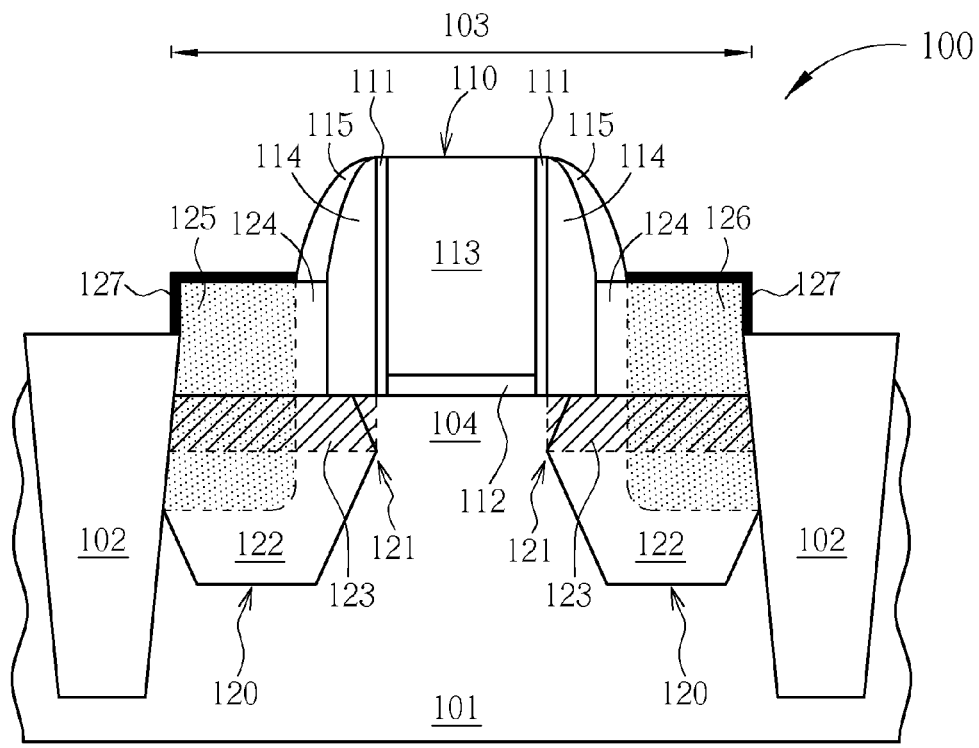

Afterwards, as shown in FIG. 9, optionally a silicide 127 may be formed to cover the doped epitaxial material 122 to lower the sheet resistance of contact plugs (not shown) of the semiconductor element. Generally speaking, the silicide 127 is disposed at the exposed surface of cap layer 124 to cover cap layer 124 together with the outer spacer 115. The procedures to form the silicide 127 may be as follows. First, a suitable metal such as Ti, Ni or Co (not shown) is used to completely cover the shallow trench isolations 102, the gate structure 110 and the surface of the cap layer 124. Later, a thermal step is carried out to let the metal react with Si to form the silicide 127. At last, the unreacted metal is removed and another optional thermal step may be carried out.

Since only the cap layer 124 contains silicon and both the surface of the shallow trench isolations 102 and the gate structure 110 are silicon free, the metal can only react with the cap layer 124 and the resultant silicide 127 is only present at the exposed surface of the cap layer 124. If the top of the cap layer 124 is higher than the top of the shallow trench isolations 102, the resultant silicide 127 may be also present above the shallow trench isolations 102, and at the sides of the cap layer 124. In addition, the cap layer 124 segregates the complete lightly doped drain region 123 from the silicide 127 so that the lightly doped drain region 123 is in no way in direct contact with the silicide 127.

Figure 10:
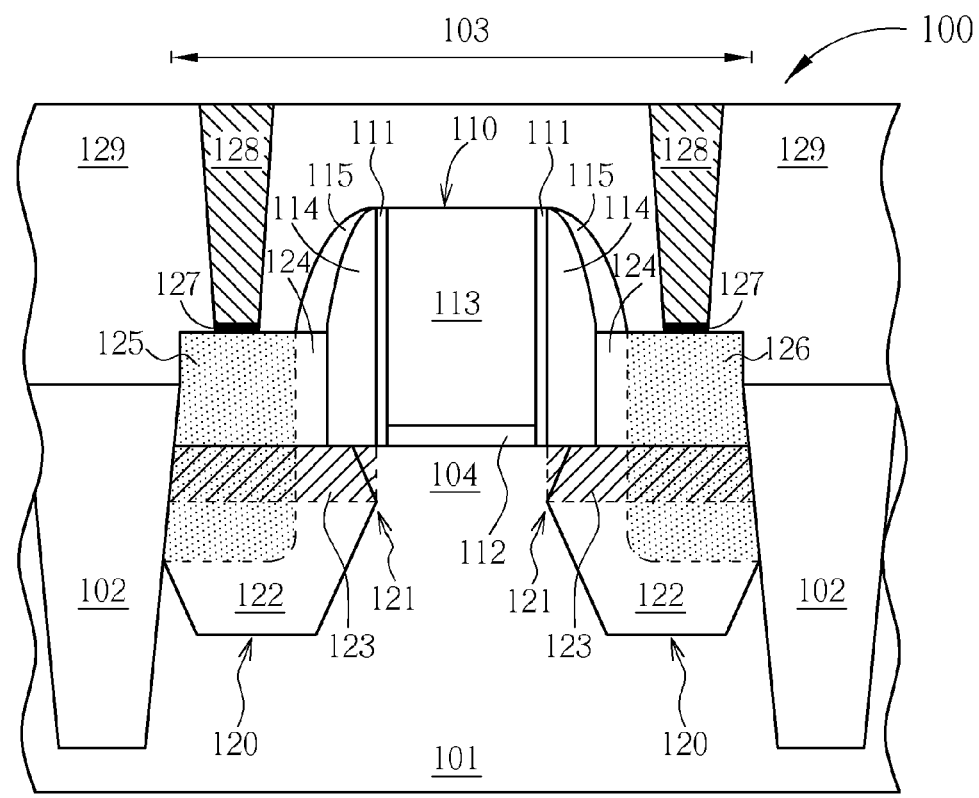

Alternatively, as shown in FIG. 10, optionally the silicide 127 may be formed after the formation of an interlayer dielectric layer 129 so that a contact plug 128 which is disposed in the interlayer dielectric layer 129 may completely cover the silicide 127 and is electrically connected to the cap layer 124 to lower the sheet resistance of contact plugs 128 of the semiconductor element. For example, first the interlayer dielectric layer 129 is formed to completely cover the cap layer 124 and the gate structure 110. Then, the interlayer dielectric layer 129 is etched to form a contact hole (not shown) which exposes the cap layer 124. The contact hole (not shown) may be filled with a suitable metal such as Ti, Ni or Co (not shown) after a thermal step to form the silicide 127 and the unreacted metal may be replaced by a contact plug metal to form a contact plug 128 which penetrates the interlayer dielectric layer 129. Or alternatively, the metal to form the silicide 127 remains in the contact hole (not shown) to serve as the contact plug 128 as well.

Following this, other needed semiconductor steps may be carried out, such as to replace the gate material layer 113 with an apt metal material to obtain a metal gate, the formation of contact holes, or the formation of contact plugs ... etc. The contact plugs (not shown) for the source 125 and the drain 126 may have asymmetric shapes, such as in a rectangular shape for one and in a shape of an extending strip for the other. These necessary steps are well known to persons in the art and the details will not be elaborated here.

By the way, one of the features of the present invention resides in that the doping step in the region 103 for the complete lightly doped drain region (LDD) 123 is always carried out after the formation of the recess 120 so that the etching of the recess 120 does not jeopardize the doping step in the region 103 for the complete lightly doped drain region (LDD) 123. Besides, since the cap layer 124 segregates the complete lightly doped drain region 123 from the silicide 127, the resultant silicide 127 does not consume or not directly contact the complete lightly doped drain region (LDD) 123. In such a way, a semiconductor structure 100 with a complete lightly doped drain region is obtained. Were it not for this and the doping step in the region 103 for the complete lightly doped drain region (LDD) 123 being carried out before the formation of the recess 120, the etching of the recess 120 would be bound to damage the profile of the lightly doped drain region (LDD) 123 or even slash the LDD region no matter how perfect the profile of the lightly doped drain region may be. In such a way, the lightly doped drain region (LDD) 123 would be greatly deficient and it would cause the semiconductor element to have poor saturated current value ($I_{sat}$) and jeopardize the reliability of the semiconductor structure. Another feature of the present invention resides in that no spacers of the gate structure needs slashing and the complete lightly doped drain region (LDD) is still capable of extending to the substrate below the spacers to reach the gate channel.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor structure, comprising:
   a substrate;
   a gate structure disposed on said substrate;
   at least one recess disposed in said substrate, adjacent to said gate structure;
   a doped epitaxial material filling up said at least one recess;
   a lightly doped drain region disposed within said doped epitaxial material and at a top of said doped epitaxial material; and
   a cap layer comprising an undoped epitaxial material, disposed on said doped epitaxial material and covering said doped epitaxial material, wherein said lightly doped drain region is sandwiched between a bottom of said doped epitaxial material and said cap layer; and
   an outer spacer surrounding said gate structure and being on the top of said cap layer.

2. The semiconductor structure of claim 1, further comprising:
   a silicide at least partially covering said cap layer, wherein said cap layer segregates said lightly doped drain region from said silicide so that said silicide does not contact said lightly doped drain region.

3. The semiconductor structure of claim 2, further comprising:
   an interlayer dielectric layer covering said cap layer and said gate structure; and
   a contact plug disposed in said interlayer dielectric layer and electrically connected to said cap layer, wherein said silicide disposed on said cap layer and completely covering said cap layer.

4. The semiconductor structure of claim 2, further comprising:
   an interlayer dielectric layer covering said cap layer and said gate structure; and
   a contact plug disposed in said interlayer dielectric layer and electrically connected to said cap layer, wherein said silicide disposed on said cap layer so that said contact plug completely covers silicide, and said outer spacer, said interlayer dielectric layer and said silicide together cover said cap layer.

5. The semiconductor structure of claim 1, further comprising a spacer disposed between said gate structure and said outer spacer, and said cap layer and said spacer together cover said lightly doped drain region.

6. The semiconductor structure of claim 1, wherein said gate structure further comprises a spacer simultaneously in direct contact with both said cap layer and said lightly doped drain region.

7. The semiconductor structure of claim 1, wherein said at least one recess further comprises a tip disposed under said gate structure and said lightly doped drain region overlaps said tip.

8. The semiconductor structure of claim 1, wherein said lightly doped drain region extends to below said gate structure.

9. The semiconductor structure of claim 1, wherein said gate structure is one of a PMOS gate and an NMOS gate.

10. The semiconductor structure of claim 1, wherein said doped epitaxial material comprises two different tetravalent elements.

11. The semiconductor structure of claim 1, wherein said lightly doped drain region completely overlaps said top of said doped epitaxial material and extends to below said gate structure.

12. The semiconductor structure of claim 1, further comprising a source doping region disposed in said cap layer, wherein said source doping region does not entirely overlap said cap layer.

13. A semiconductor structure, comprising:
   a substrate;
   a gate structure disposed on said substrate;
   at least one recess disposed in said substrate, adjacent to said gate structure;
   a doped epitaxial material filling up said at least one recess;
   a lightly doped drain region disposed at a top of said doped epitaxial material;
   a cap layer comprising an undoped epitaxial material, disposed on said doped epitaxial material and covering said doped epitaxial material;
   a silicide at least partially covering said cap layer, wherein said cap layer segregates said lightly doped drain region from said silicide so that said silicide does not contact said lightly doped drain region;
   an interlayer dielectric layer covering said cap layer and said gate structure;
   a contact plug disposed in said interlayer dielectric layer and electrically connected to said cap layer; and
   an outer spacer surrounding said gate structure, wherein said silicide disposed on said cap layer so that said contact plug completely covers silicide, and said outer spacer, said interlayer dielectric layer and said silicide together cover said cap layer.

* * * * *